United States Patent [19]

Chu

[11] Patent Number: 5,994,782
[45] Date of Patent: Nov. 30, 1999

[54] SURFACE TREATMENT EQUIPMENT FOR TREATING CIRCUIT BOARDS

[76] Inventor: Chin Shin Chu, No. 24, Lane. 118, San Lung St., Shu Lin Town Taipei Hsien, Taiwan

[21] Appl. No.: 09/288,961

[22] Filed: Apr. 9, 1999

[51] Int. Cl.[6] .............................. H01L 23/48; C25D 17/00
[52] U.S. Cl. .......................... 257/773; 204/201; 134/22.1
[58] Field of Search ..................................... 257/773, 678, 257/732, 733, 731

[56] References Cited

U.S. PATENT DOCUMENTS

| | | | |
|---|---|---|---|
| 4,620,894 | 11/1986 | Gurian et al. | 156/345 |
| 4,964,365 | 10/1990 | D'Amato | 118/419 |
| 5,176,158 | 1/1993 | Ketelhohn et al. | 134/32 |
| 5,378,307 | 1/1995 | Bard et al. | 156/639 |
| 5,529,081 | 6/1996 | Kappler | 134/64 |
| 5,601,737 | 2/1997 | Asahi et al. | 219/121.66 |

*Primary Examiner*—Mahshid Saadat
*Assistant Examiner*—Jhihan B Clark
*Attorney, Agent, or Firm*—Bacon & Thomas

[57] ABSTRACT

A circuit board surface treatment equipment, which includes an upper solution chamber and a bottom solution chamber defined within a machine base at different elevations, a set of conveying rollers and upper and lower bumper rollers arranged in the upper solution chamber and controlled to deliver circuit boards through the upper solution chamber for treatment, upper and lower pressure-balanced water knives respectively mounted in gaps in between the conveying rollers and controlled to eject a surface treatment solution onto the circuit boards, and water level control switch means which open the passage between the upper solution chamber and the bottom solution chamber for letting the surface treatment solution flow from the upper solution chamber to the bottom solution chamber when the level of surface treatment solution in the upper solution chamber surpasses a predetermined high level.

3 Claims, 7 Drawing Sheets

SURFACE TREATMENT EQUIPMENT FOR TREATING CIRCUIT BOARDS

BACKGROUND OF THE INVENTION

The present invention relates to a surface treatment equipment for treating circuit boards, and more particularly to such a circuit board surface treatment equipment which uses pressure-balanced water knives to eject a surface treatment solution onto circuit boards being carried through the equipment, enabling the surface of each circuit board to be well treated.

In a regular horizontal PTH type circuit board surface treatment equipment, water knives are operated to eject a surface treatment solution onto the surface of the circuit boards being carried through the equipment, enabling the surface of each circuit board to be treated. A water knife for this purpose is, as shown in FIG. 1, comprised of an elongated tube 1 having a longitudinal series of jet nozzles 11 through which the surface treatment solution is forced out of the elongated tube 1 to treat the surface of the circuit boards. Because the jet nozzles 11 have an equal diameter and are longitudinally arranged in a line, and the surface treatment solution is forced to the jet nozzles 11 one after another, the jets of surface treatment solution from the jet nozzles 11 have different pressure. Because jets of surface treatment solution are ejected onto the circuit boards at different pressure, the surface of each circuit board cannot be uniformly treated.

SUMMARY OF THE INVENTION

The present invention has been accomplished to provide a circuit board surface treatment equipment which eliminates the aforesaid problem. According to one aspect of the present invention, the circuit board surface treatment equipment comprises an upper solution chamber and a bottom solution chamber defined within a machine base at different elevations, a set of conveying rollers and upper and lower bumper rollers arranged in the upper solution chamber and controlled to deliver circuit boards through the upper solution chamber for treatment, upper and lower pressure-balanced water knives respectively mounted in gaps in between the conveying rollers and controlled to eject a surface treatment solution onto the circuit boards, and water level control switch means which open the passage between the upper solution chamber and the bottom solution chamber for letting the surface treatment solution flow from the upper solution chamber to the bottom solution chamber when the level of surface treatment solution in the upper solution chamber surpasses a predetermined high level. According to another aspect of the present invention, each pressure-balanced water knife is comprised of a sleeve, an inner tube inserted through the sleeve, water seal means mounted around the inner tube to seal two opposite ends of the sleeve, the sleeve comprising a longitudinal series of narrow, elongated jet nozzles, the inner tube comprising a closed first end, an opened second end, a longitudinal series of water outlets arranged between the closed first end and the opened second end, and a connector mounted in the opened second end for guiding a surface treatment solution into the inner tube, the water outlets having diameters one greater than another in order from the opened second end toward the closed first end. This design enables jets of surface treatment solution which come from the jet nozzles at the sleeve have an equal pressure.

DETAILED DESCRIPTION OF THE PREFERRED EMBODIMENT

Figure 1:
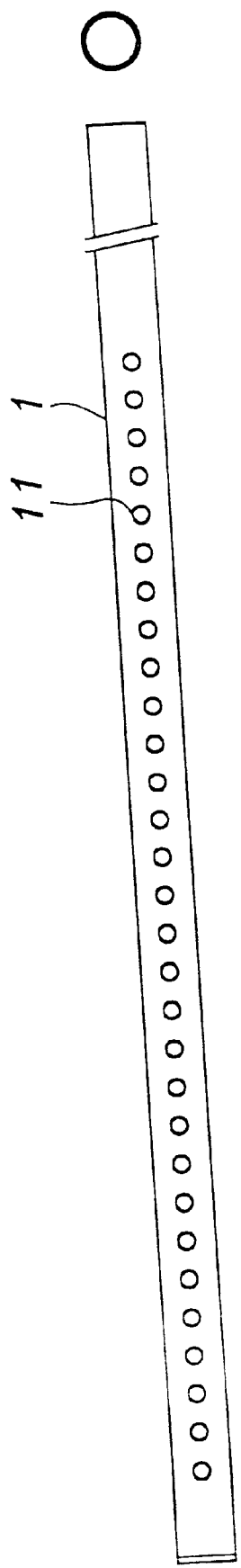
FIG. 1 illustrates a water knife for use in a circuit board surface treatment equipment according to the prior art.
Figure 2:
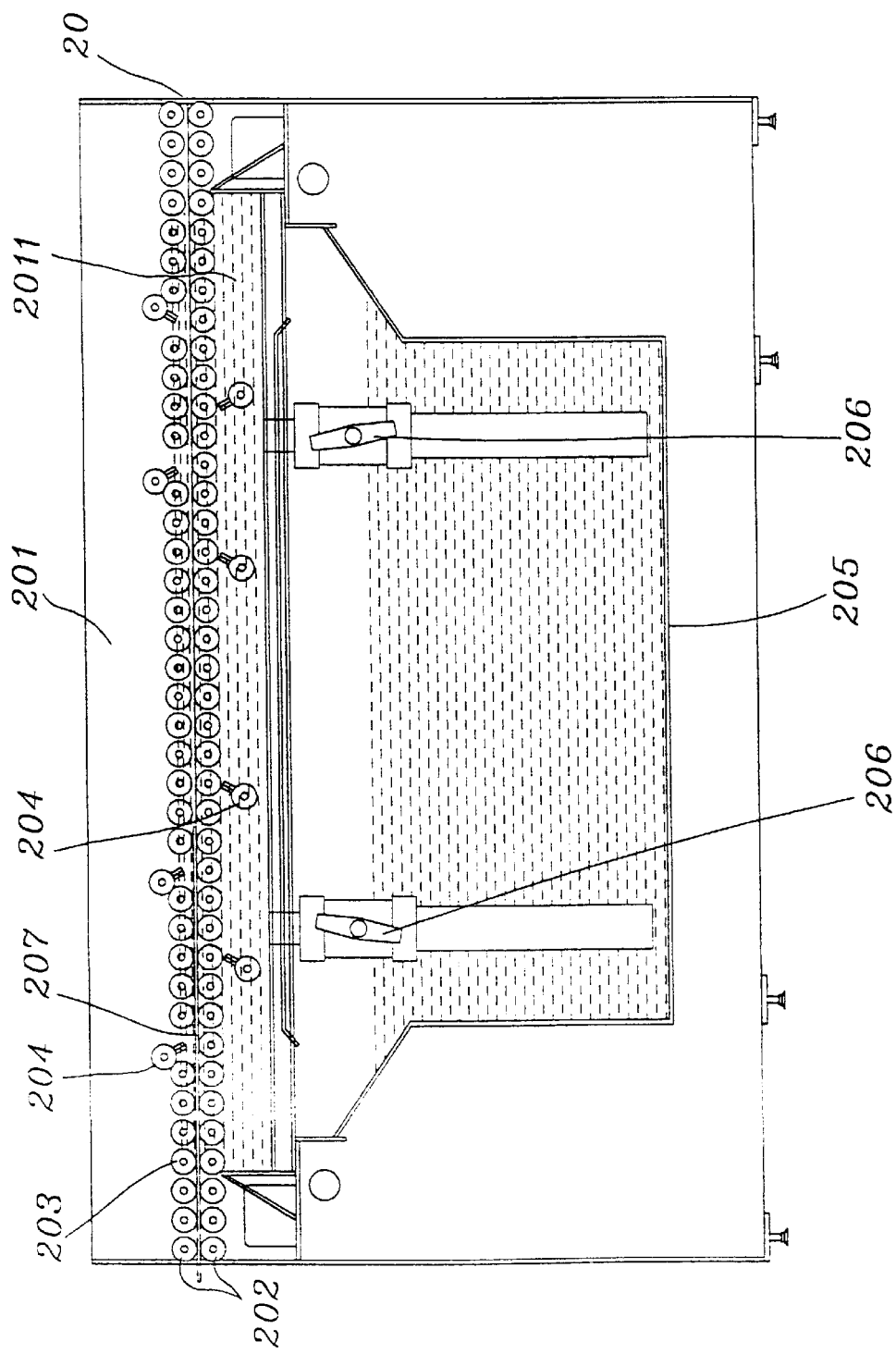
FIG. 2 is a plain view of a circuit board surface treatment equipment according to the present invention.
Figure 3:
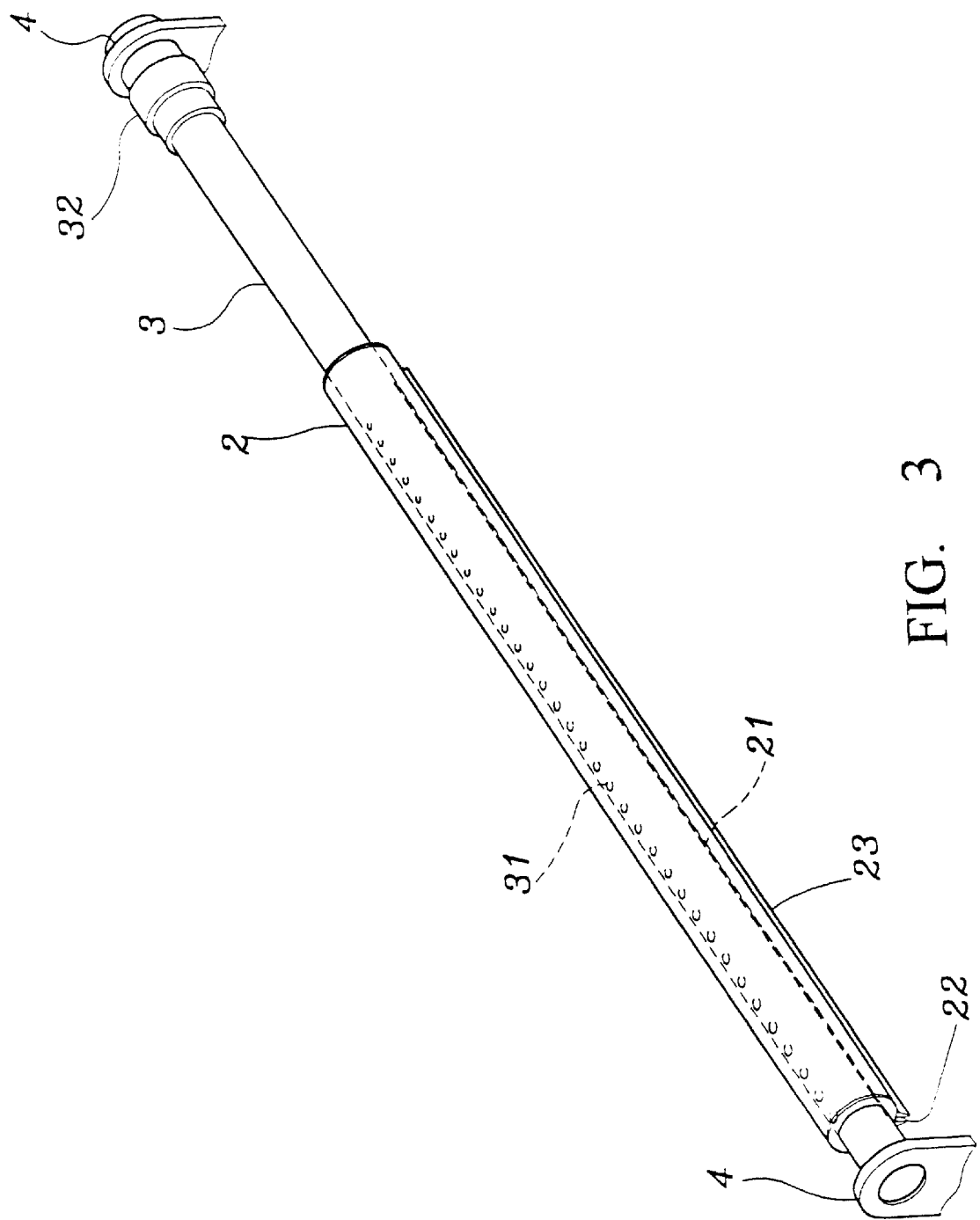
FIG. 3 is a perspective view of a water knife according to the present invention.
Figure 4:
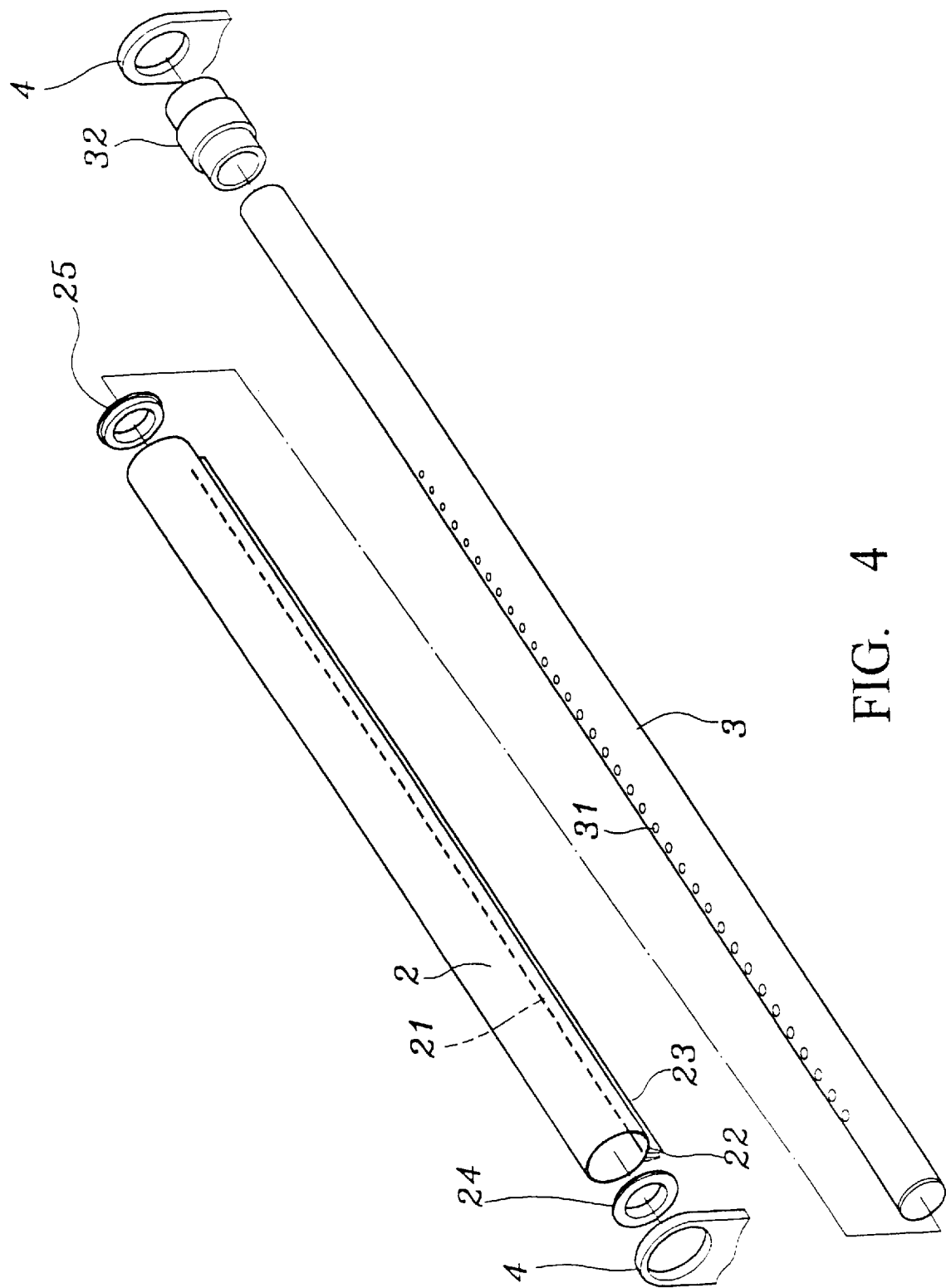
FIG. 4 is an exploded view of the water knife shown in FIG. 3.
Figure 5:
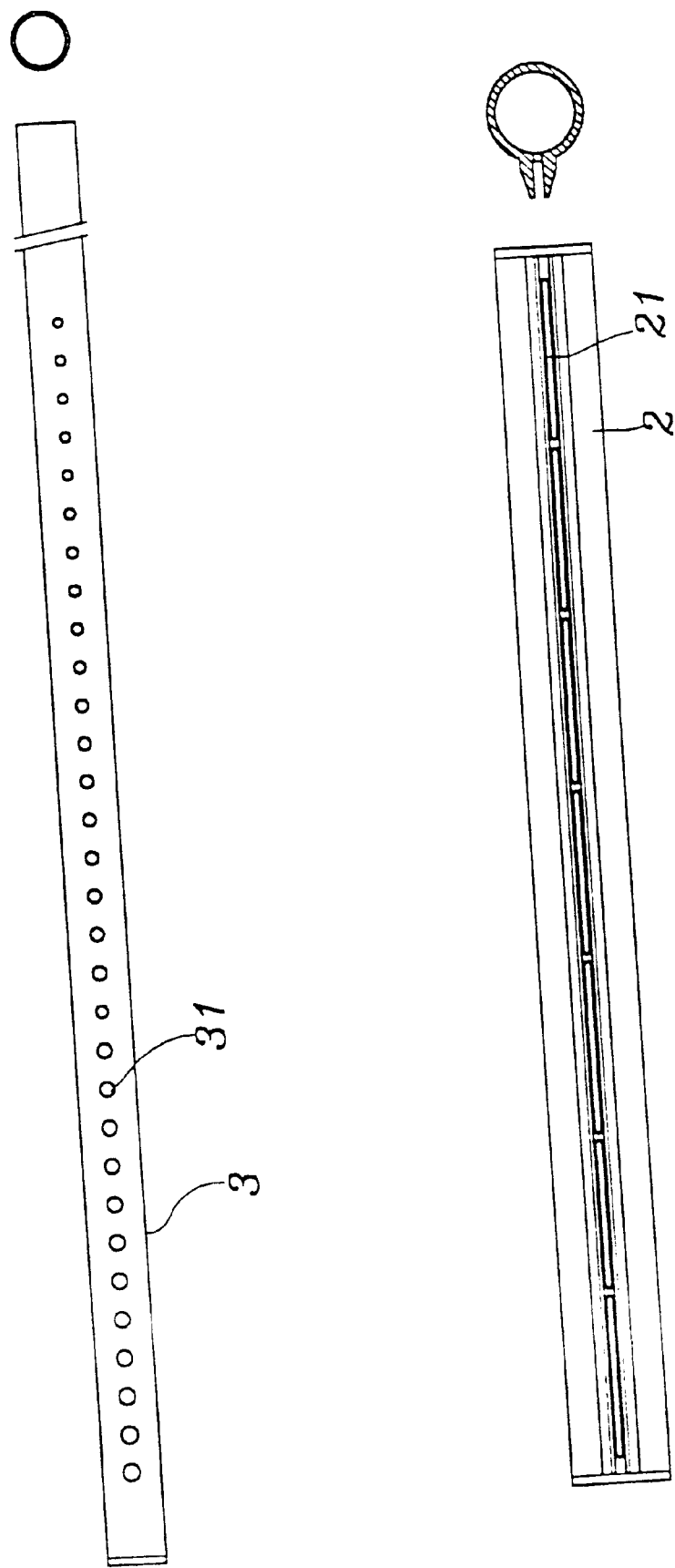
FIG. 5 is a plain view of FIG. 4.

Referring to FIG. 2, a surface treatment equipment is shown comprised of a machine base 20, an upper solution chamber 201 defined within the machine base 20 at the top and holding a surface treatment solution 2011, a set of conveying rollers 202 and upper and lower bumper rollers 203 arranged in the upper solution chamber 201, upper and lower pressure-balanced water knives 204 mounted in gaps in between the conveying rollers 202 and dipped in the surface treatment solution 2011 inside the upper solution chamber 201, a bottom solution chamber 205 defined within the machine base 20 below the upper solution chamber 201, and two water level control switches 206 which open the passage between the upper solution chamber 201 and the bottom solution chamber 205 for letting the surface treatment solution 2011 flow from the upper solution chamber 201 to the bottom solution chamber 205 when the level of the surface treatment solution 2011 in the upper solution chamber 201 surpasses a predetermined high level (above the horizontal circuit board path), or cut off power supply from the machine and trigger an alarm means (not shown) when the level of the surface treatment solution 2011 in the upper solution chamber 201 drops below a predetermined low level (below the horizontal circuit board path). When the workpiece, namely, the circuit board is delivered through the upper solution chamber 201 by the conveying rollers 202 and the bumper rollers 203, the surface treatment solution 2011 is ejected onto the top and bottom sides of the circuit board by the upper and lower pressure-balanced water knives 204, causing the surface of the circuit board to be treated with a laminar flow of surface treatment solution, and therefore the surface of the circuit board is well treated.

Referring to FIGS. from 3 through 5, the pressure-balanced water knife 204 is comprised of a sleeve 2, and an inner tube 3 which is relatively longer than the sleeve 2. The sleeve 2 has a longitudinal series of narrow, elongated jet nozzles 21, and two longitudinal flanges 22 and 23 perpendicularly raised from the periphery and longitudinally extended at two opposite sides of the elongated jet nozzles 21. The inner tube 3 comprises a longitudinal series of water outlets 31 of different orders arranged in proper order. The inner tube 3 has one end opened, and the other end closed. After insertion of the inner tube 3 into the sleeve 2, the two opposite ends of the sleeve 2 are respectively sealed by water seal rings 24 and 25, then the open end of the inner tube 3 is mounted with a connector 32, and then the close end of the inner tube 3 and the connector 32 at the open end of the inner tube 3 are respectively fastened to respective supports 4 in the upper solution chamber 201. The surface treatment solution is guided into the inner tube 3 through the connector 32, then forced out of the inner tube 3 into the inside space of the sleeve 2 through the water outlets 31, and then forced out of the sleeve 2 through the narrow, elongated jet nozzles 21. Before passing out of the narrow, elongated jet nozzles 21, the pressure of the surface treatment solution is balanced.

Figure 6:
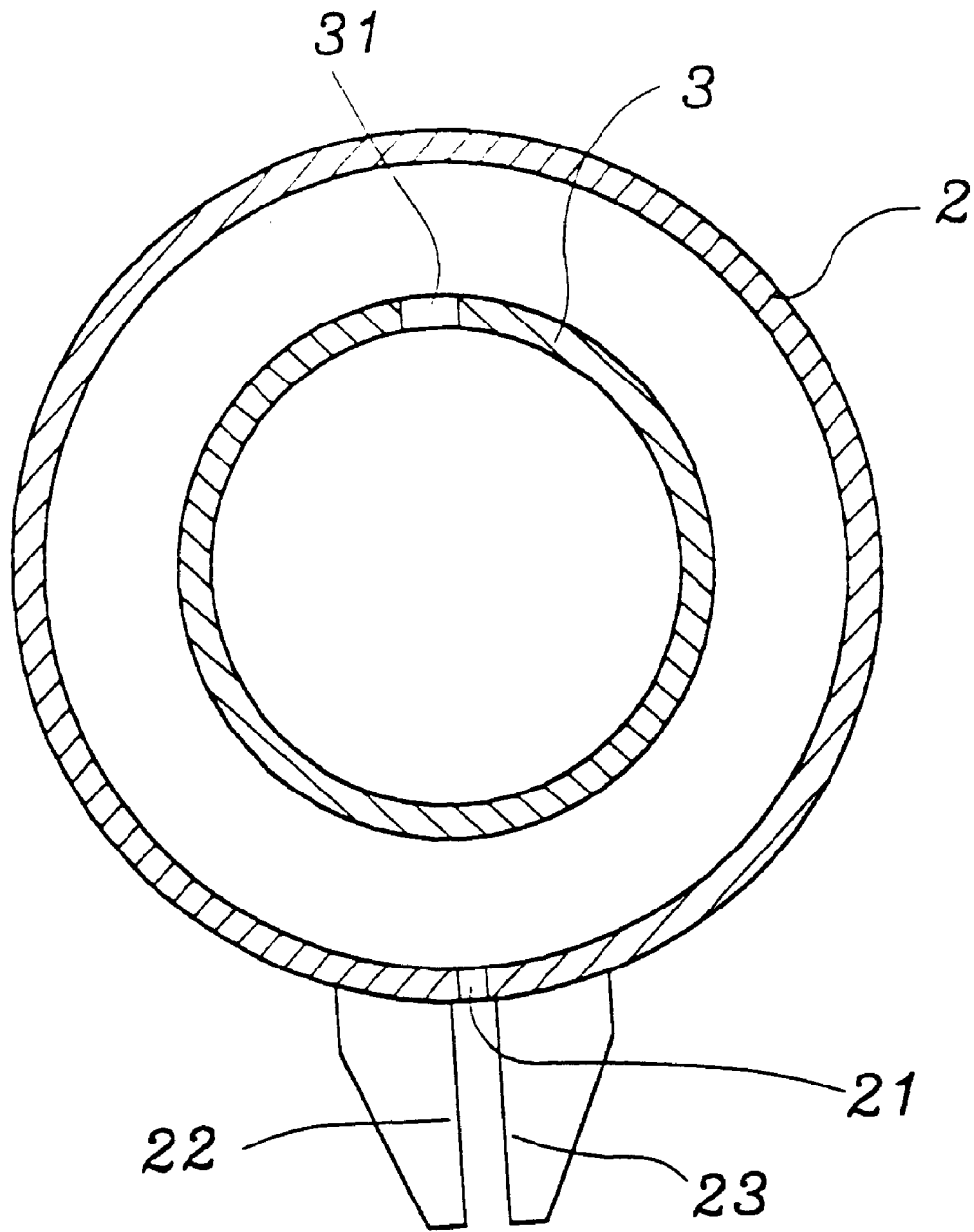
FIG. 6 is a cross sectional view in an enlarged scale of FIG. 3.
Figure 7:
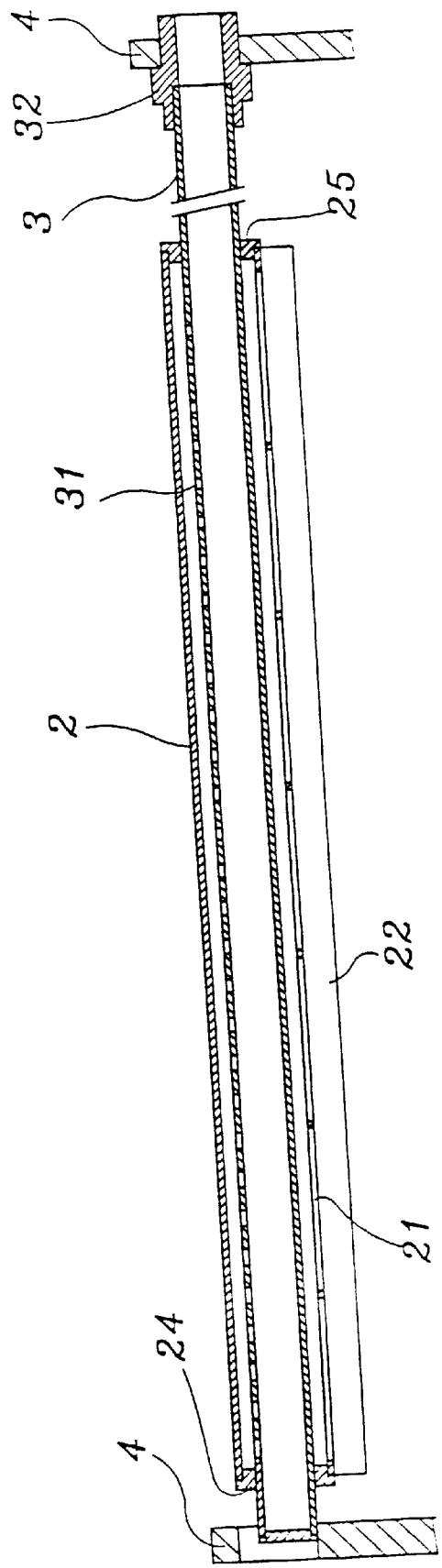
FIG. 7 is a longitudinal view in section of FIG. 3.

Referring to FIGS. 6 and 7, when the surface treatment solution is guided into the inner tube 3, it is compressed in the inner tube 3, then forced out of the inner tube 3 through the water outlets 31, and then circulated in the sleeve 2 and forced out of the sleeve 2 through the jet nozzles 21. Because the surface treatment solution is circulated in the sleeve 2 and then forced out of the sleeve 2 through the jet nozzles 21, the pressure of the surface treatment solution is balanced, and the circuit board (workpiece) is well treated with a laminar flow of surface treatment solution.

Because the water outlets 31 are arranged in order subject to their diameters, i.e., in such a manner that the ones having relatively smaller diameter are arranged closer to the open end (the end in which the connector 32 is installed) of the sleeve 3 and the ones having relatively greater diameter are arranged closer to the close end of the sleeve 3, the pressure of the surface treatment solution is relatively buffered when the surface treatment solution passes through the water outlets 31. Therefore, the pressure of the surface treatment solution is balanced before passing out of the jet nozzles 21 at the sleeve 2. Further, the longitudinal flanges 22 and 23 each have a transverse thickness gradually reducing toward the end remote from the periphery of the sleeve 2. This design prevents the longitudinal flanges 22 and 23 from deformation due to the pressure of the surface treatment solution.

While only one embodiment of the present invention has been shown and described, it will be understood that various modifications and changes could be made thereunto without departing from the spirit and scope of the invention disclosed.

What the invention claimed is:

1. A circuit board surface treatment equipment comprising:

a machine base;

an upper solution chamber defined within said machine base at an upper side for holding a surface treatment solution;

a set of conveying rollers and upper and lower bumper rollers arranged in said upper solution chamber and controlled to deliver circuit boards to be treated through said upper solution chamber;

upper and lower pressure-balanced water knives respectively mounted in gaps in between said conveying rollers and controlled to eject a surface treatment solution onto the circuit boards being carried through said upper solution chamber by said conveying rollers and upper and lower bumper rollers;

a bottom solution chamber defined within said machine base below said upper solution chamber and communicated with said upper solution chamber through a passage; and water level control switch means which open the passage between said upper solution chamber and said bottom solution chamber for letting the surface treatment solution flow from said upper solution chamber to said bottom solution chamber when the level of surface treatment solution in said upper solution chamber surpasses a predetermined high level.

2. The circuit board surface treatment equipment of claim 1 wherein said pressure-balanced water knives each are comprised of a sleeve, an inner tube inserted through said sleeve, water seal means mounted around said inner tube to seal two opposite ends of said sleeve, said sleeve comprising a longitudinal series of narrow, elongated jet nozzles, said inner tube comprising a closed first end, an opened second end, a longitudinal series of water outlets arranged between said closed first end and said opened second end, and a connector mounted in said opened second end for guiding a surface treatment solution into said inner tube, said water outlets having diameters one greater than another in order from the opened second end toward the closed first end.

3. The circuit board surface treatment equipment of claim 1 wherein said sleeve comprises two longitudinal flanges perpendicularly raised from the periphery thereof and longitudinally extended at two opposite sides of said narrow, elongated jet nozzles, said longitudinal flanges each having a transverse thickness gradually reducing toward the end remote from the periphery of said sleeve.

* * * * *